United States Patent
Philip et al.

(10) Patent No.: US 11,189,527 B2
(45) Date of Patent: Nov. 30, 2021

(54) SELF-ALIGNED TOP VIAS OVER METAL LINES FORMED BY A DAMASCENE PROCESS

(71) Applicant: International Business Machines Corporation, Armonk, NY (US)

(72) Inventors: Timothy Mathew Philip, Albany, NY (US); Sagarika Mukesh, Albany, NY (US); Dominik Metzler, Clifton Park, NY (US); Ashim Dutta, Menands, NY (US); John Christopher Arnold, North Chatham, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/826,944

(22) Filed: Mar. 23, 2020

(65) Prior Publication Data

US 2021/0296169 A1 Sep. 23, 2021

(51) Int. Cl.
| | |
|---|---|
| *H01L 23/48* | (2006.01) |
| *H01L 21/768* | (2006.01) |
| *H01L 23/528* | (2006.01) |
| *H01L 23/522* | (2006.01) |

(52) U.S. Cl.
CPC .. *H01L 21/76879* (2013.01); *H01L 21/76816* (2013.01); *H01L 23/528* (2013.01); *H01L 23/5226* (2013.01)

(58) Field of Classification Search
CPC ............. H01L 21/768; H01L 21/76879; H01L 21/76816; H01L 23/5226; H01L 23/528
See application file for complete search history.

(56) References Cited

U.S. PATENT DOCUMENTS

| | | |
|---|---|---|
| 4,758,528 A | 7/1988 | Goth et al. |
| 8,312,394 B2 | 11/2012 | Ban et al. |
| 8,874,253 B2 | 10/2014 | Chen et al. |
| 9,196,523 B2 | 11/2015 | Lin |
| 9,240,346 B2 | 1/2016 | Lee et al. |
| 9,543,165 B2 | 1/2017 | Yen |
| 9,711,447 B1 | 7/2017 | Shu et al. |

(Continued)

FOREIGN PATENT DOCUMENTS

WO 2019100899 A1 5/2019

*Primary Examiner* — Phuc T Dang
(74) *Attorney, Agent, or Firm* — Abdy Raissinia; Ryan, Mason & Lewis, LLP

(57) ABSTRACT

A method includes forming a plurality of elongated dielectric members on a semiconductor substrate. The elongated dielectric members each extend vertically from the semiconductor substrate and define opposed vertical walls. The method further includes forming opposed spacer walls on the vertical walls of the elongated dielectric members. Adjacent spacer walls of longitudinally adjacent elongated dielectric members define first trenches therebetween. The method also includes depositing a first metal material within the first trenches to form a first set of first metal lines, removing the elongated dielectric members to define second trenches between the opposed spacer walls on the opposed vertical walls of each elongated dielectric member, and depositing a second metal material within the second trenches to form a second set of second metal lines. The first and second metal lines of the first and second sets are disposed in alternating arrangement.

20 Claims, 17 Drawing Sheets

(56) References Cited

U.S. PATENT DOCUMENTS

| | | | |
|---|---|---|---|
| 9,773,676 B2 | 9/2017 | Chang et al. | |
| 10,157,788 B2 | 12/2018 | Pellizzer et al. | |
| 2008/0137188 A1* | 6/2008 | Sato | G02B 5/3058 |
| | | | 359/485.05 |
| 2008/0200026 A1* | 8/2008 | Koh | H01L 21/32115 |
| | | | 438/643 |
| 2014/0017894 A1* | 1/2014 | Tsai | H01L 21/31144 |
| | | | 438/694 |
| 2018/0366370 A1 | 12/2018 | Pellizzer et al. | |
| 2019/0206725 A1* | 7/2019 | Chu | H01L 21/7688 |

\* cited by examiner

SELF-ALIGNED TOP VIAS OVER METAL LINES FORMED BY A DAMASCENE PROCESS

BACKGROUND

The present disclosure relates to semiconductor fabrication techniques and, in particular, relates to a method for patterning self-aligned vias for an interconnect structure utilizing damascene schemes.

A semiconductor integrated circuit chip is typically fabricated with a back end of the line (BEOL) interconnect structure, which comprises multiple levels of metal lines and inter-level metal vias, to connect various integrated circuit components and devices that are fabricated as part of a front-end-of-line (FEOL)/middle-of-line (MOL) layer(s) of the semiconductor integrated circuit chip. Formation of the metal vias and lines within the interconnect structure typically includes patterning of trenches in a substrate utilizing photolithographic and etching processes. Initially, a pattern of photoresist lines is formed, which is subsequently transferred to an underlying hard mask layer. The pattern is then transferred to an underlying interlayer dielectric to establish the trenches for subsequent deposition of conductive material thereby forming the patterned metal lines in the BEOL interconnect structure. However, due to reduced scaling requirements of current semiconductor devices, via alignment, even with a self-aligned via (SAV) approach, is problematic due to the accompanying reduced pitch between adjacent metal lines. This often results in misalignment of the via and undesired contact with a neighboring metal line. Moreover, known processes are deficient in consistently producing self-aligned vias, thereby rendering semiconductor devices which are prone to shorts in the circuitry and other significant degradations in yield, performance, and reliability.

SUMMARY

In an illustrative embodiment, a method comprises forming a plurality of elongated dielectric members on a semiconductor substrate. The elongated dielectric members each extend vertically from the semiconductor substrate and define opposed vertical walls. The method further comprises forming opposed spacer walls on the vertical walls of the elongated dielectric members. Adjacent spacer walls of longitudinally adjacent elongated dielectric members define first trenches therebetween. The method also comprises depositing a first metal material within the first trenches to form a first set of first metal lines, removing the elongated dielectric members to define second trenches between the opposed spacer walls on the opposed vertical walls of each elongated dielectric member, and depositing a second metal material within the second trenches to form a second set of second metal lines. The first and second metal lines of the first and second sets are disposed in alternating arrangement.

In another illustrative embodiment, a method comprises forming a dielectric template on a semiconductor substrate. The template comprises a plurality of longitudinally spaced elongated dielectric members. The method further comprises depositing a spacer material onto the semiconductor substrate to fill spaces between the elongated dielectric members and etching the spacer material to form opposed spacer walls on each elongated dielectric member. Adjacent spacer walls of longitudinally adjacent dielectric members form first trenches therebetween. The method further comprises forming a first plug wall within at least one of the first trenches, depositing a first metallic material into the first trenches to form a first pattern of first metal lines wherein the first plug wall forms a first line break in at least one of the first metal lines, and forming a first via in contact with a select first metal line. A mandrel cap material is deposited on each of the first metal lines and the first via. The method further comprises removing the elongated dielectric members via an etching process selective to a material of the spacer walls to form second trenches between the spacer walls of each elongated dielectric member and forming a second plug wall within at least one of the second trenches. A second metallic material is deposited into the second trenches to form a second pattern of second metal lines. The second plug wall forms a second line break within at least one of the second metal lines. A via opening is formed to extend to a select second metal line utilizing an etching process selective to the mandrel cap material on the first metal lines. A second via is formed to contact the select second metal line.

In another illustrative embodiment, a semiconductor device comprises a semiconductor substrate defining a longitudinal axis, a first pattern of first metal lines longitudinally spaced on the semiconductor substrate, a first via extending to a select first metal line and a second pattern of second metal lines longitudinally spaced on the semiconductor substrate. The first and second metal lines of the first and second patterns are disposed in alternating arrangement on the semiconductor substrate. A mandrel cap material is disposed on the first metal lines of the first pattern and the first via.

DETAILED DESCRIPTION

Figure 1:
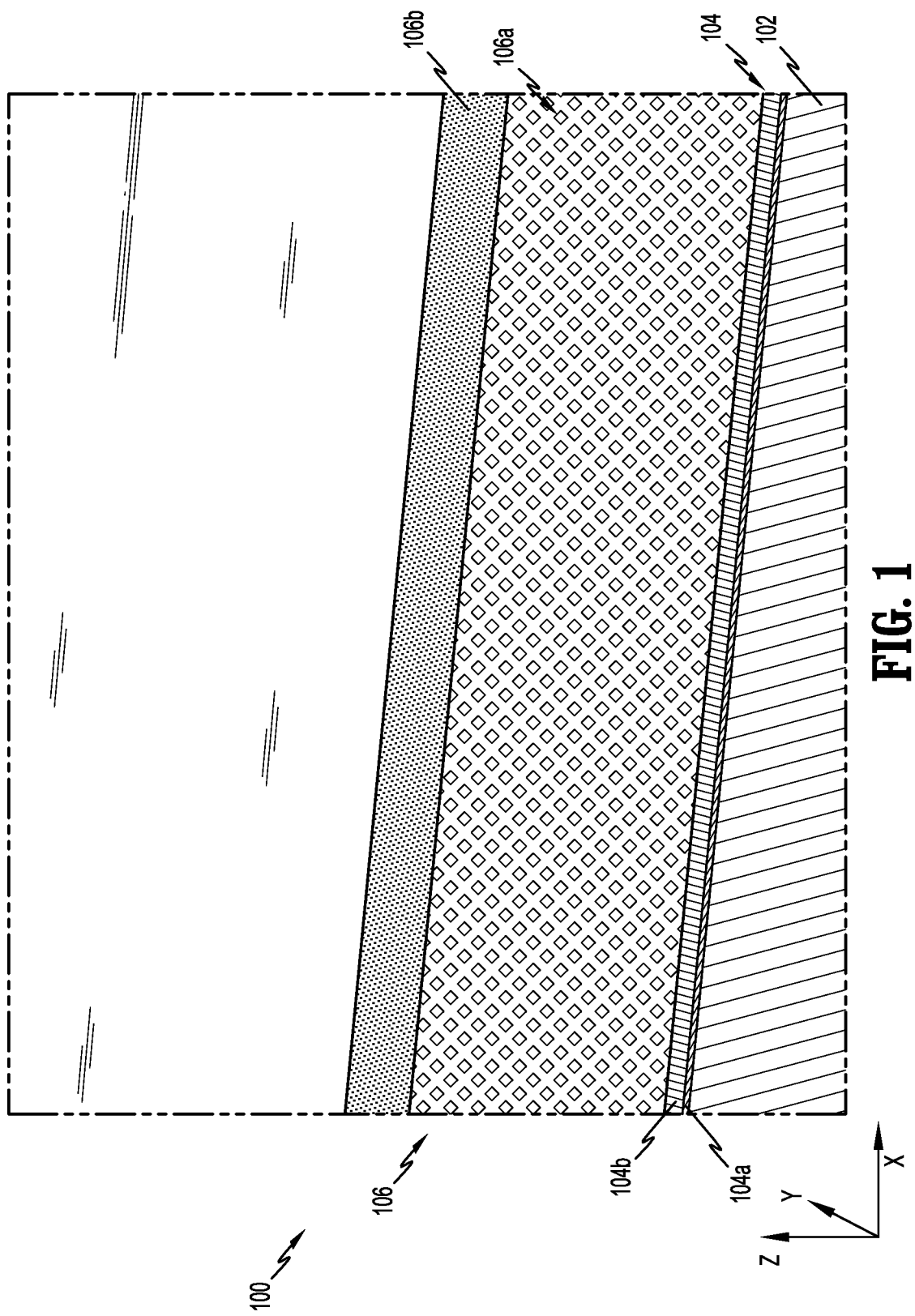
FIG. 1 is a perspective view in cross-section of a semiconductor structure at a first intermediate stage of fabrication according to one or more illustrative embodiments.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" or "connected" can include both an indirect "connection" and a direct "connection." The terms "on" or "onto" with respect to placement of components relative to the semiconductor structure or stack is not to be interpreted as requiring direct contact of the components for it is possible one or more intermediate components, layers or coatings may be positioned between the select components unless otherwise specified. More specifically, positional relationships, unless specified otherwise, can be direct or indirect, and the present invention is not intended to be limiting in this respect.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of threedimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Back-end-of-line (BEOL) processes are generally focused on forming metal interconnects between the different devices of the integrated circuit whereas the fabrication of the different devices that make up the integrated circuit are generally formed during the front end of line (FEOL) processing.

In accordance with an embodiment of the present invention, multi-patterning methods are utilized to fabricate an array of metal lines where a first set of metal lines, e.g., odd lines, of a first pattern are metallized and capped with a protective mandrel cap material, and then a second set of metal lines, e.g., even lines, are patterned and metallized. First and second vias may be formed to extend to select first and second metal lines of the first and second sets. The via opening for the second via may be formed with an etching process selective to the mandrel cap material on the first metal lines. This provides a larger margin for patterning of the lithographic mask and also prevents the second via from overlapping onto any neighboring adjacent first odd line or first via. For illustrative purposes, patterning methods will be discussed which implement self-aligned double patterning (SADP) or self-aligned litho-etch litho-etch (SALELE) methods in conjunction with damascene processes to fabricate an array of lines in different stages of patterning, such as, for example, back end of line (BEOL), front end of line (FEOL), and middle of line (MOL) applications.

Exemplary embodiments of the invention will now be discussed in further detail with regard to semiconductor devices and methods of manufacturing same and, in particular, to forming a BEOL interconnect structure with an alternating arrangement of odd and even lines. Initially, a template dielectric is formed from a dielectric material to define a plurality of longitudinally spaced elongated dielectric members or segments within the dielectric material. Thereafter, a spacer material is deposited within the trenches defined between the elongated dielectric members and etched to define spacer walls surrounding each dielectric member mandrel. Adjacent spacer walls on adjacent dielectric members define a plurality of first trenches therebetween. A metallization process deposits metal within the first trenches to form a first pattern of odd metal lines. At least one first via is formed and extends to one of the odd lines. The odd lines and the one via are covered with a protective mandrel cap material. The presence of the mandrel cap material assists in distinguishing between the odd and subsequently formed even lines. Thereafter, second trenches are formed through removal of the elongated dielectric members via an etching process selective to the mandrel cap material and spacer walls thereby preserving the integrity of the previously formed odd lines and the first via. The second trenches are subjected to a metallization process to form even metal lines of a second pattern. At least one second via is formed and extends to one of the even lines.

In the discussion that follows, the semiconductor structure, which will incorporate one or more BEOL interconnects, will be referred to as the "semiconductor structure 100" throughout the various stages of fabrication, as represented in all the accompanying drawings. It is to be appreciated that the various stages described herein are not necessarily distinct stages. Moreover, one or more stages may be combined or performed in a different sequence than that explicitly described herein. Other stages or processes are also contemplated.

FIGS. 1-17 schematically illustrate, in perspective and partial cross-sectional views, the semiconductor structure 100 at various stages of fabrication and forming of a multi-patterning interconnect comprising an alternating arrangement of odd and even metal lines of first and second metal patterns or sets, respectively. FIG. 1 illustrates the semiconductor structure 100 at a first early intermediate stage of fabrication comprising a semiconductor substrate 102, an etch stop 104 on the semiconductor substrate 102 and a dielectric layer 106 formed on the etch stop 104.

While the semiconductor substrate 102 is illustrated as a generic substrate layer, it is to be understood that the semiconductor substrate 102 may comprise one of different types of semiconductor substrate structures and materials. For example, in one embodiment, the semiconductor substrate 102 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 102 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL. The semiconductor substrate 102 may include a FEOL/MOL layer or structure comprising various semiconductor structures and components that are formed in or on the active surface of the semiconductor substrate 102 to provide integrated circuitry for a target application. For example, the FEOL structure may comprise field-effect transistor (FET) devices (such as FinFET devices, vertical FET devices, planar FET devices, etc.), bipolar transistors, diodes, capacitors, inductors, resistors, isolation devices, etc., which are formed in or on the active surface of the semiconductor substrate 102. In general, FEOL processes typically include preparing the semiconductor substrate 102 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The semiconductor substrate 102 may further comprise a MOL structure or layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts (not shown) that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure.

With continued reference to FIG. 1, the etch stop 104 is formed on the semiconductor substrate 102 using known deposition techniques. In one illustrative embodiment, the etch stop 104 comprises two different layers 104a, 104b of material to form a bilayer etch stop 104. In the alternative, the etch stop 104 may be a single material of one or more layers. The layers of the etch stop 104 may include any suitable material, such as, for example, a titanium nitride (TiN), silicon nitride (SiN) or metal oxides including titanium oxide (TiOx), a silicon-rich anti-reflective coating (SiARC), silicon oxynitride (SiON), silicon dioxide (SiO2), a titanium-rich anti-reflective coating (TiARC), etc. and can have a thickness of about 5 nm to about 50 nm. The etch stop 104 may be deposited on the semiconductor substrate 102 using any known techniques including, for example, a plasma enhanced atomic layer deposition (PEALD) process, a plasma-enhanced chemical vapor deposition (PECVD) process, a physical vapor deposition (PVD) process, a chemical vapor deposition (CVD), or an atomic layer deposition (ALD), etc. The layers 104a, 104b of the etch stop 104 may comprise different materials. The materials of the etch stop 104 are selected to eventually be etched away via any suitable etching process including, for example, a reactive ion etching (RIE) (with, e.g., a halogen-based plasma chemistry) or wet etching. In illustrative embodiments, the etch stop 104 is formed of a material that has etch selectivity with respect to materials of the dielectric layer 106.

The dielectric layer 106 may comprise a "low k" insulating/dielectric material such as silicon dioxide (e.g. SiO2), silicon nitride (SiN), silanol (SiOH), hydrogenated silicon nitride (SiNH), silicon carbide (SiC), silicon carbon nitride (SiCN), hydrogenated silicon carbide (SiCH), fluorine-doped silicon oxide (SiOF), carbon doped oxide (CDO), silicon oxycarbide (SiOC) films or organosilicate (SiOCH) low-k films and other similar types of insulating/dielectric materials or porous dielectrics. The dielectric layer 106 may be formed using known deposition techniques, such as, for example, atomic layer deposition (ALD), chemical vapor deposition (CVD), plasma-enhanced CVD (PECVD), physical vapor deposition (PVD), or spin-on deposition. The thickness (along the vertical "z" axis) of the dielectric layer 106 will vary depending on the application and may range be in a range of 30 nm to about 200 nm. In illustrative embodiments, the dielectric layer 106 may comprise two individual layers 106a, 106b fabricated from different dielectric materials, and deposited via any of the aforementioned processes. For example, layers 106a, 106b may have different densities of oxides such as tetraethyl orthosilicate (TEOS) for layer 106a and octamethylcyclotetrasiloxane (OMCTS) (also known as D4) for layer 106b.

Figure 2:
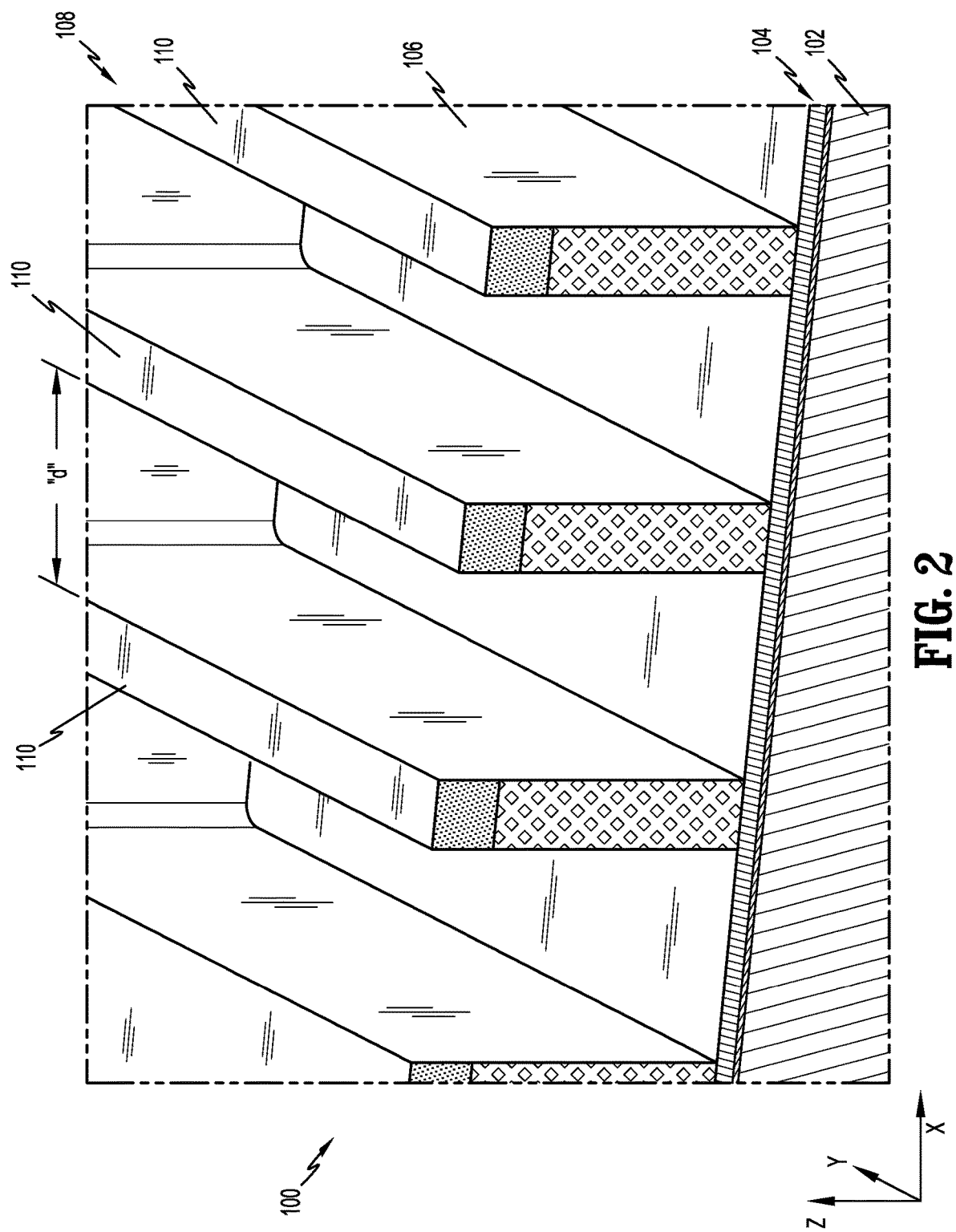
FIG. 2 is a perspective view in cross-section of the semiconductor structure at a second intermediate stage of fabrication according to one or more illustrative embodiments.

FIG. 2 illustrates the semiconductor structure 100 at a second intermediate stage of fabrication. In accordance with the second stage, the semiconductor structure 100 is subjected to one or more conventional lithographic and etching processes to form a dielectric template 108 within the dielectric layer 106. The dielectric template 108 comprises a plurality of elongated dielectric members 110 within the dielectric layer 106. In particular, through one or more etching processes selective to the underlying etch stop 104, the dielectric layer 106 is etched to define a plurality of longitudinally spaced elongated dielectric members 110 extending vertically (i.e., along the "z" axis). In illustrative embodiments, adjacent elongated dielectric members 110 are spaced a distance "d" which is specifically determined or calculated to be equal to a predetermined width of a metal line to be deposited between the adjacent elongated dielectric members 110 plus two times a predetermined desired spacing between adjacent metal lines.

The elongated dielectric members 110 can be patterned using e-beam lithography, optical lithography, nanoimprint lithography, directed self-assembly of block copolymers, or a combination thereof, and related etch techniques. For example, the dielectric layer 106 can be etched using a photolithography process wherein, for example, a layer of "negative" photoresist material is deposited and patterned using a bright-field mask to form a photoresist mask which defines an image of the array of the elongated dielectric members 110. The array of elongated dielectric members 110 is formed by transferring the image of the photoresist mask into the sacrificial dielectric layer 106 using a suitable etch process. The etch process may be a dry plasma etch process (e.g., RIE (reactive ion etch)) having an etch chemistry that is suitable to etch the material of the sacrificial insulating/dielectric layer selective to the etch stop 104. In this regard, the etch stop 104 serves as a stop for the selected etch process.

Figure 3:
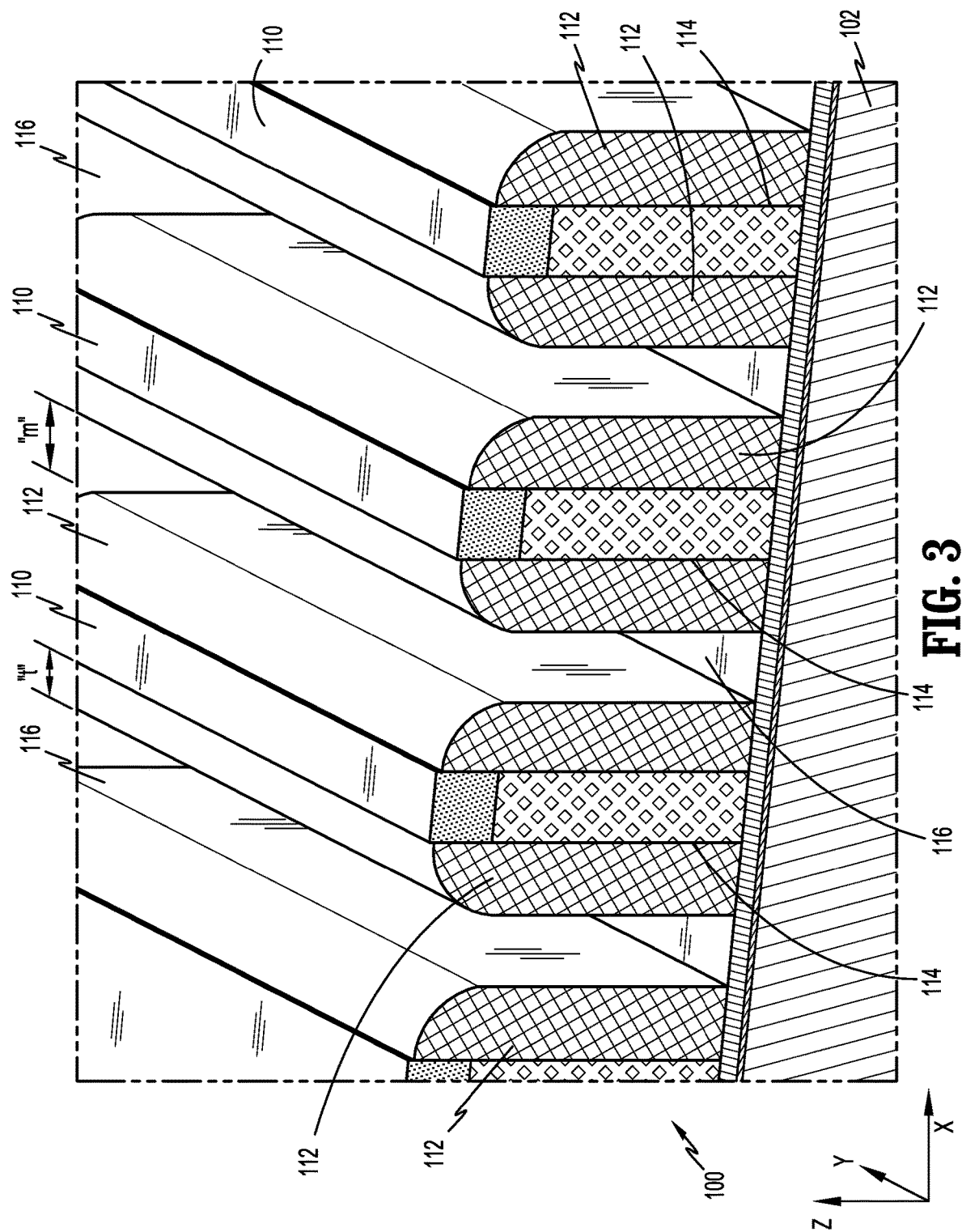
FIG. 3 is a perspective view in cross-section of the semiconductor structure at a third intermediate stage of fabrication according to one or more illustrative embodiments.

Referring now to FIG. 3, a third intermediate stage of fabrication of the semiconductor structure 100 comprises forming spacer walls 112 on the opposed vertical sidewalls 114 of the elongated dielectric members 110. For example, a conformal layer of spacer material may be deposited over the surface of the semiconductor structure 100 to conformally cover the elongated dielectric members 110 and the semiconductor substrate 102. In one illustrative embodiment, the conformal layer of spacer material comprises a dielectric/insulating material which is conformally deposited using known methods such as ALD or PVD, and etched via conventional etch processes to form the opposed spacer walls 112 on the elongated dielectric members 110.

The conformal layer of spacer material is preferably formed of a material which has etch selectivity with respect to the dielectric material of the elongated dielectric members 110 and the materials of the etch stop 104. For example, the conformal layer of spacer material can be formed of a silicon oxide, a silicon nitride, a silicon carbide, etc. The conformal spacer material is subjected to one or more removal processes including an etching process and/or planarization process to form the spacer walls 112 and remove any residual spacer material above the elongated dielectric members 110. In one illustrative embodiment, the spacer etch process is performed using a directional dry etch process (anisotropic), such as RIE, having an etch chemistry which is suitable to etch the spacer material selective to the materials of the elongated dielectric members 110 and the underlying etch stop 104. The spacer walls 112 are formed and etched to define a thickness "t." The adjacent spacer walls 112 of longitudinally adjacent elongated dielectric members 110 define a distance "m" which is generally equal to the desired metal line width to be formed between the spacer walls 112. Moreover, adjacent spacer walls 112 of longitudinally adjacent elongated dielectric members 110 define a first or odd set of trenches 116 which eventually receive metal during a metallization process to form a first pattern of odd metal lines.

Figure 4:
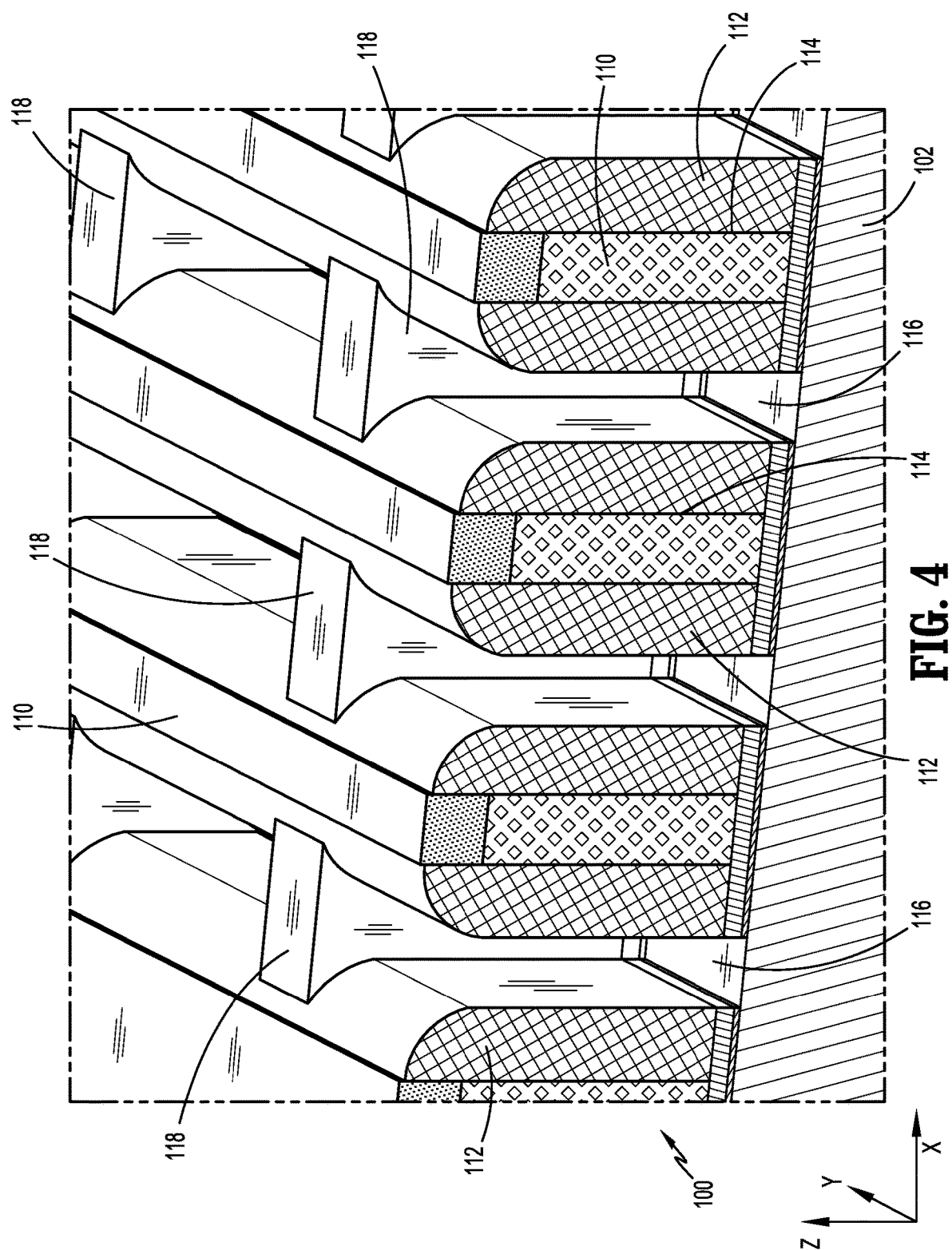
FIG. 4 is a perspective view in cross-section of the semiconductor structure at a fourth intermediate stage of fabrication according to one or more illustrative embodiments.

Referring now to FIG. 4, in a fourth intermediate stage of fabrication, a plug fill material is deposited within the first trenches 116 to at least partially, or completely, fill the first trenches 116. Using known lithographic and etching and/or planarization processes, the plug material is patterned to define one or more plug walls 118 within the first trenches 116. The plug walls 118 correspond to breaks to be formed in one or more odd metal lines of the first pattern within the semiconductor structure 100. The material of the plug walls 118 may include any suitable materials such as oxides (including silicon dioxide ($SiO_2$), spin on glass, etc.), nitrides (such as silicon nitride (SiN)), and may be deposited using known deposition techniques. In addition, portions of the etch stop 104 within the first trenches 116 are also removed upon etching of the plug material or through the use of one or more additional etching processes.

Figure 5:
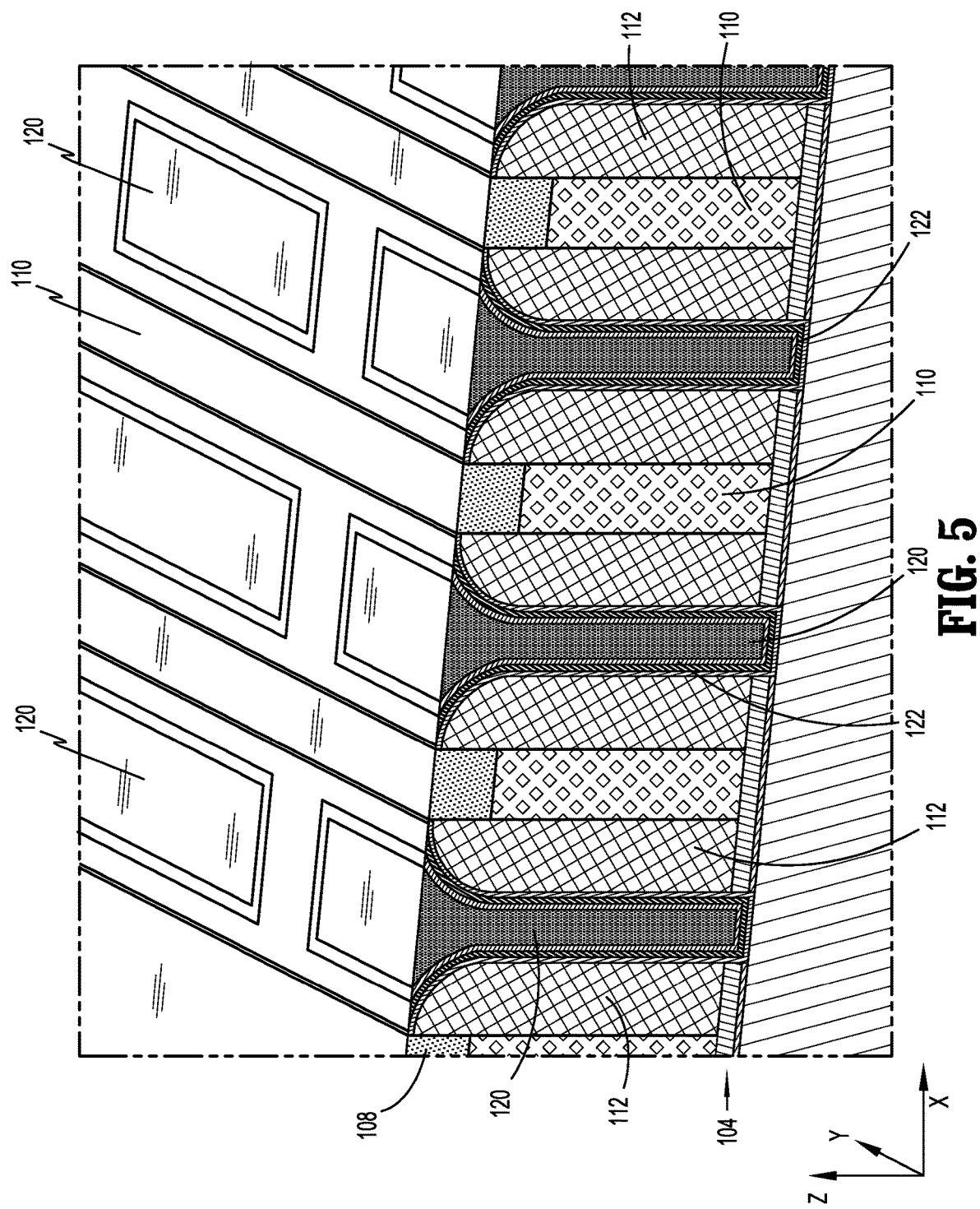
FIG. 5 is a perspective view in cross-section of the semiconductor structure at a fifth intermediate stage of fabrication according to one or more illustrative embodiments.

Referring now to FIG. 5, a fifth intermediate stage of fabrication includes a metallization process where bulk metallic material 120 is deposited in the first trenches 116. In illustrative embodiments, the metallic material 120 may comprise copper (Cu). In other illustrative embodiments, the metallic material 120 can be, for example, aluminum (Al), tungsten (W), iridium (Ir), cobalt (Co), ruthenium (Ru), or alloys thereof. Additionally, one or more thin metal liners 122 comprising metals such as titanium nitride (TiN), tantalum nitride (TaN), ruthenium (Ru), etc. can be deposited first as a barrier or an adhesion layer followed by the bulk metal deposition. The bulk metallic material 120 is deposited using known dry deposition techniques such as ALD, PVD or CVD or wet deposition techniques such as electroplating, and electroless plating, etc. Thereafter, the semiconductor structure 100 is subjected to a planarization process to remove excess bulk metallic material and planarize the upper surface of the semiconductor structure. The planarization process may include a chemical-mechanical polish (CMP) process with a suitable etch slurry. The metallic material 120 is polished back to be coterminous with the top of the dielectric template 108, i.e., the top of the elongated dielectric members 110.

Figure 6:
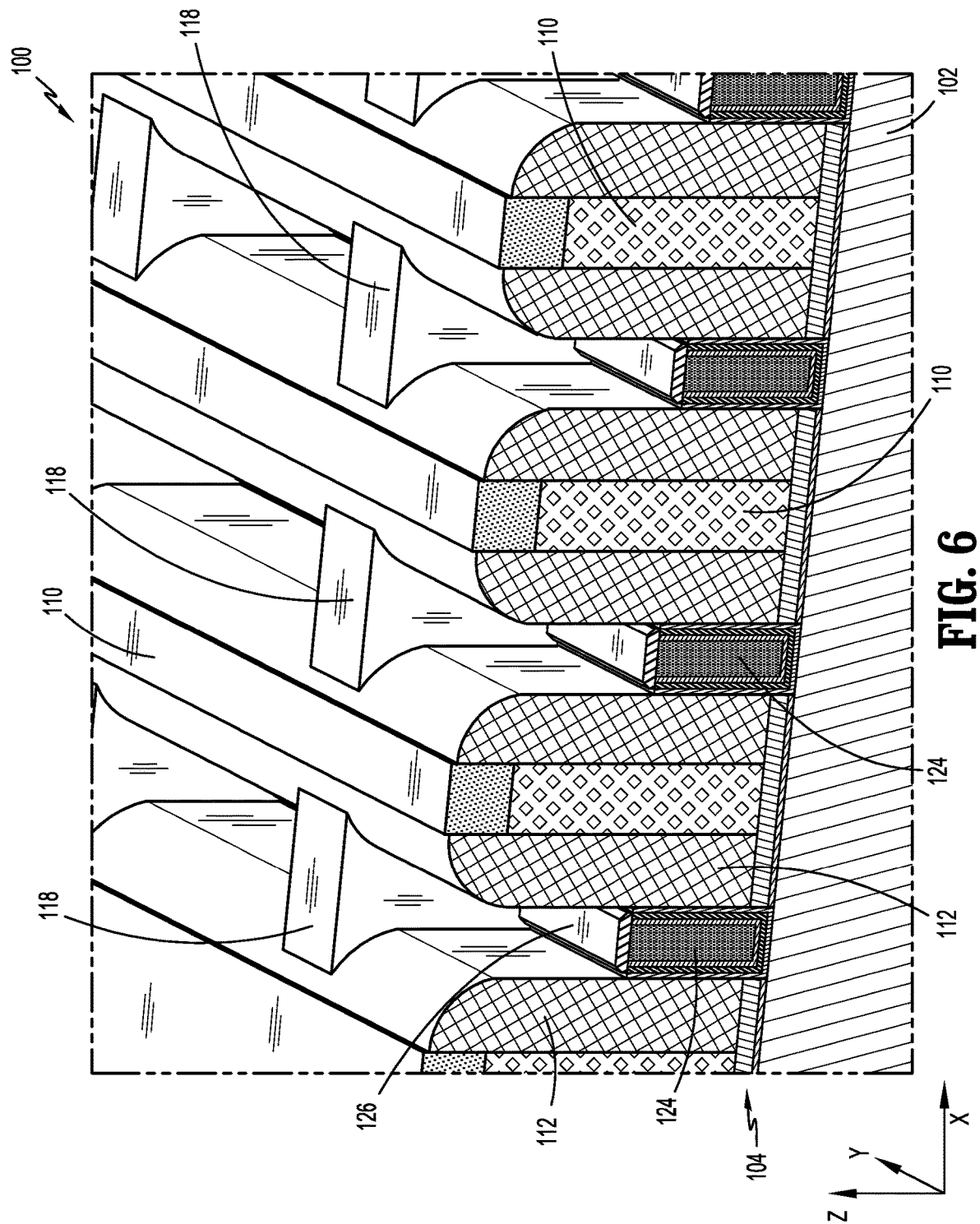
FIG. 6 is a perspective view in cross-section of the semiconductor structure at a sixth intermediate stage of fabrication according to one or more illustrative embodiments.

With reference now to FIG. 6, a sixth intermediate phase of fabrication of the semiconductor structure includes incorporating one or more removal processes to recess the metallic material 120 to form a first pattern of odd metal lines 124 within the first trenches 116. In illustrative embodiments, the odd metal lines 124 define a vertical height (along the z-axis) about one-half (½) the vertical height of the dielectric template 108 or the elongated dielectric members 110. Other heights are also contemplated. The removal processes include any of the etching, planarization or chemical-mechanical polish (CMP) processes identified hereinabove. Thus, a first pattern of odd metal lines 124 is formed in the first trenches 116. In illustrative embodiments, the odd metal lines 124 include a via conductor layer 126 formed of a suitable conductive material to enhance contact with a subsequently formed via.

Figure 7:
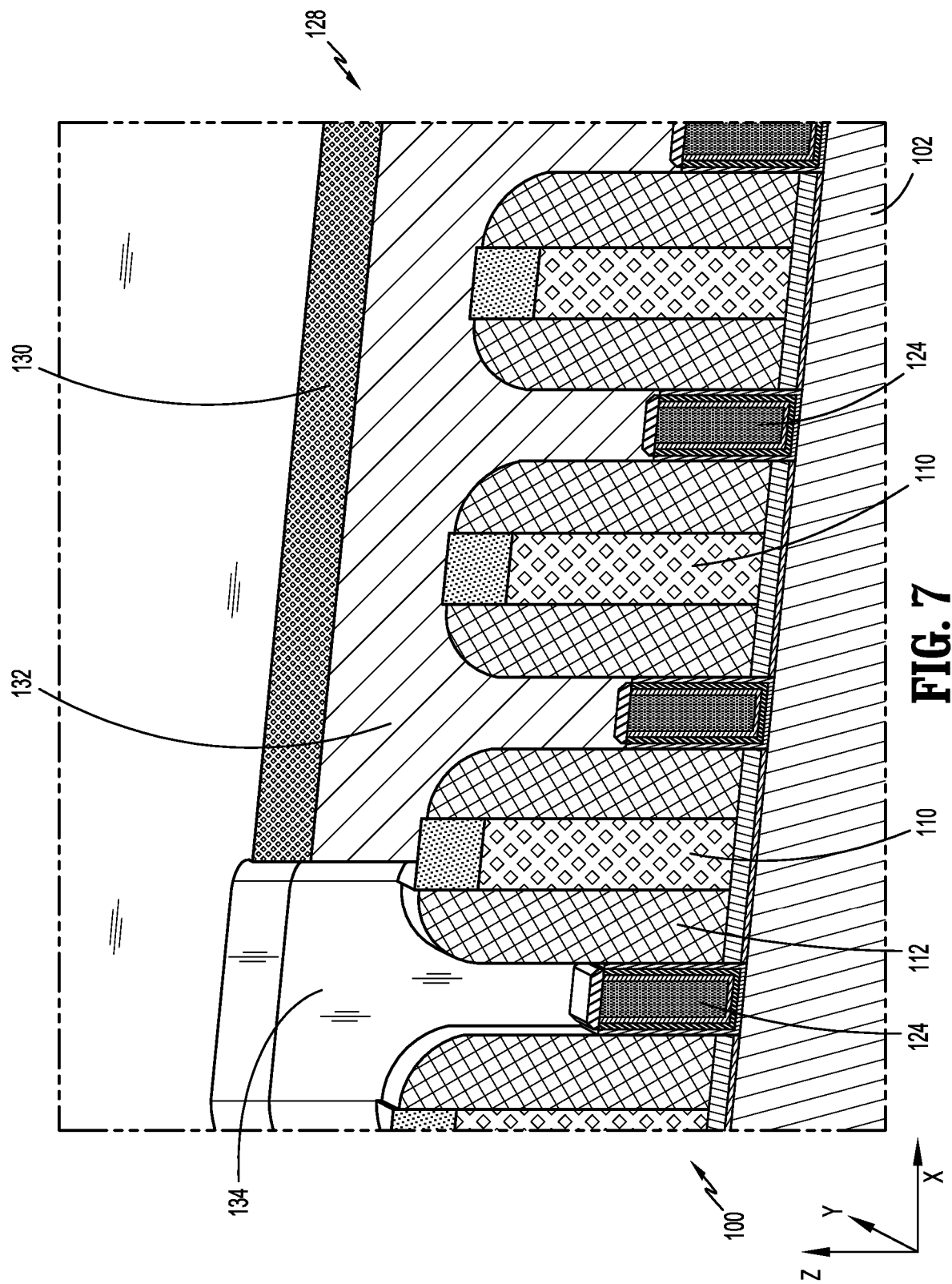
FIG. 7 is a perspective view in cross-section of the semiconductor structure at a seventh intermediate stage of fabrication according to one or more illustrative embodiments.

Referring now to FIG. 7, a seventh intermediate stage of fabrication of the semiconductor structure 100 is illustrated. At least one mask such as a first lithographic mask, generally denoted as reference numeral 128, is deposited on the semiconductor structure 100. The mask 128 may include a tri layer stack having a photoresist 130, an anti-reflective coating (ARC) (not specifically shown) underlying the photoresist 130, and an organic planarization layer (OPL) 132 beneath the photoresist 130 and the ARC coating. The organic planarization layer (OPL) 132 may be first deposited from solution onto the semiconductor structure 100 to fill the voids within the first trenches 116. The organic planarization layer (OPL) 132 may be deposited from solution, e.g., by any conventional deposition process, and baked at high temperature. The organic planarization layer (OPL) 132 extends above the upper surfaces of the template dielectric 108, i.e., above the elongated dielectric members 110 for a predetermined distance. The OPL 132 may be self-leveling and may achieve planarization over the surface topography without the use of etching, chemical mechanical polishing, or other conventional planarization techniques. The OPL 132 can include an organic polymer made up of a light-sensitive material that can attach to the dielectric layer 106. The OPL layer may have a thickness in ranging from about 50 nm to about 500 nm. In one illustrative embodiment, the ARC coating may comprise an organic or inorganic anti-reflection coating. In one illustrative embodiment, the ARC coating comprises a silicon ARC (Si-ARC) layer. In an illustrative embodiment, the photoresist 130 is formed by depositing (e.g., spin coating) a layer of photoresist material over the ARC coating, and then exposing and developing the layer of photoresist material to form a photoresist pattern. The photoresist 130 can be a layer of a positive photoresist material or a negative photoresist material.

FIG. 7 schematically illustrates a pattern formed by the photoresist 130. More specifically, an image of an opening 134 is patterned within the lithographic mask 128 in alignment with one of the odd metal lines 124. The image is transferred via one or more etching processes to define a via opening which extends to one select odd metal line 124 of the first pattern. The etching process utilized is selective to the materials of the spacer walls 112 and the elongated dielectric members 110, and is self-aligning with the underlying select odd metal line 124. This selectivity reduces margin concerns and permits the formation of a slightly enlarged via, e.g., a greater width, relative to the underlying odd metal line 124 enhancing electrical coupling therebetween. It is envisioned that multiple via openings may be formed with the lithographic mask or additional masks.

Figure 8:
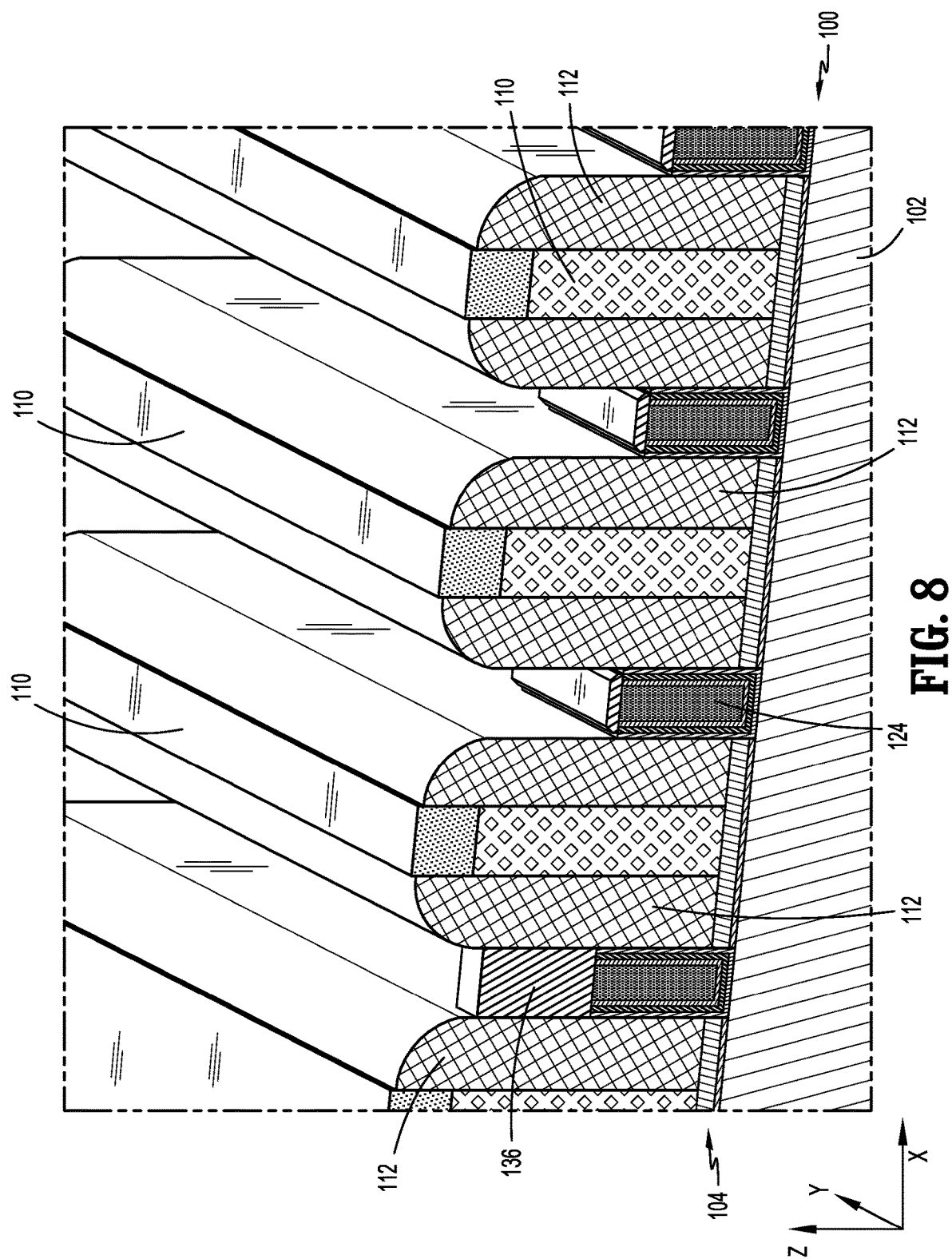
FIG. 8 is a perspective view in cross-section of the semiconductor structure at an eighth intermediate stage of fabrication according to one or more illustrative embodiments.

FIG. 8 illustrates an eighth intermediate stage of fabrication of the semiconductor structure 100. In this stage, a via 136 is created by depositing a metal, through known deposition processes, within the previously formed via opening. In illustrative embodiments, the via 136 is recessed relative to the top of the dielectric template 108 or dielectric members 110. As described hereinabove, due to the relaxed margin requirements, the via 136 has a larger width than the select odd metal line 124 to which it electrically couples. One or more planarization processes may be utilized to planarize or recess the formed via 136. In addition, the lithographic mask 128 is removed via one or more etching processes. In one illustrative embodiment, the remaining sacrificial OPL 132 is removed via an ash etching. The etching material can be an oxygen ash or a nitrogen or hydrogen-based chemistry including, for example, nitrogen gas or hydrogen gas, or a combination thereof. The ash etching process removes the sacrificial OPL material 132 with little or no gouging of the neighboring spacer walls 112 or the elongated dielectric members 110.

Figure 9:
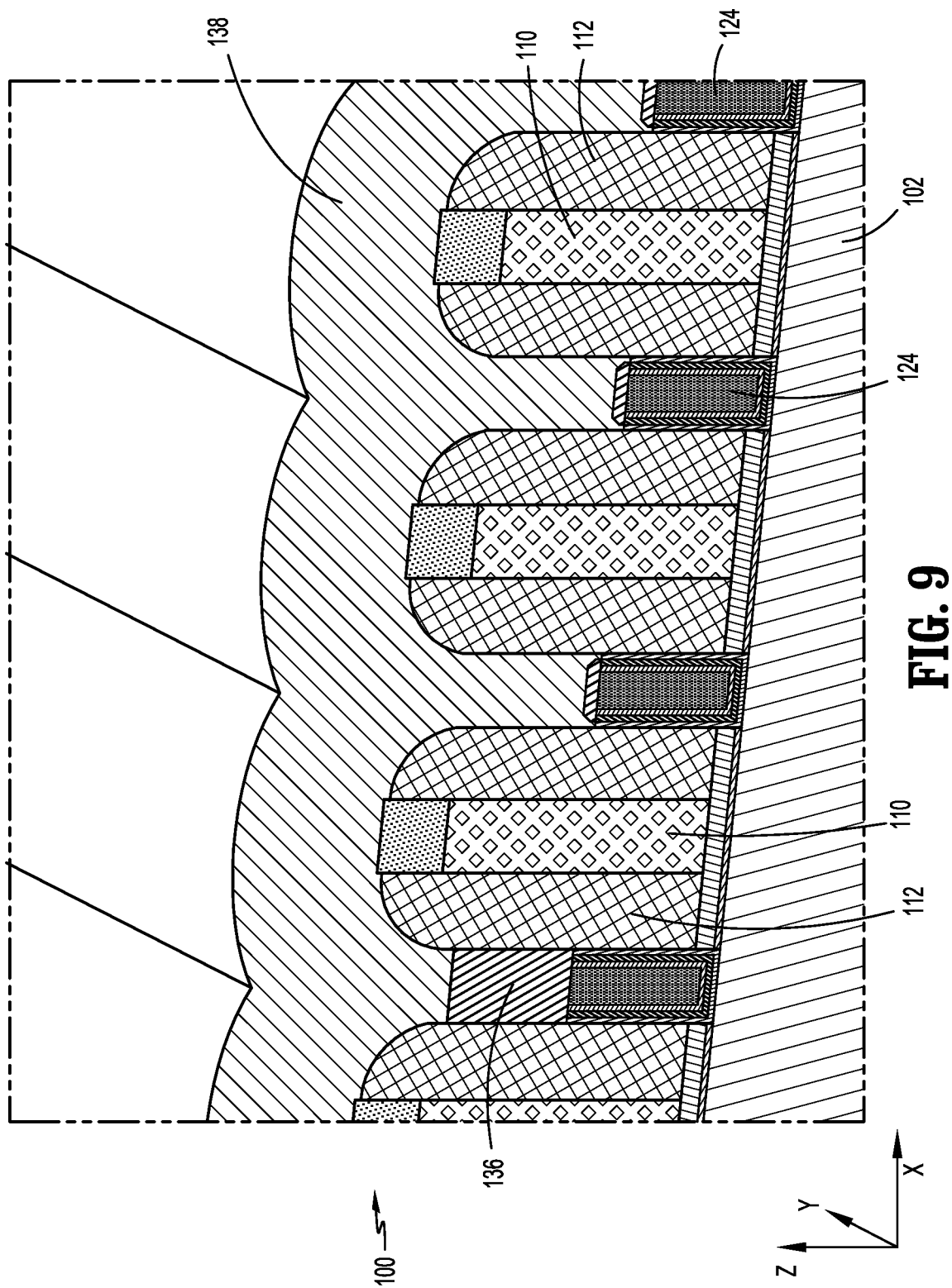
FIG. 9 is a perspective view in cross-section of the semiconductor structure at a ninth intermediate stage of fabrication according to one or more illustrative embodiments.

Referring now to FIG. 9 illustrating a ninth intermediate stage of fabrication of the semiconductor structure 100, a protective mandrel cap material 138 is deposited onto the semiconductor structure 100. The mandrel cap material 138 fills the voids within the first trenches 116 and extends above the dielectric template 108 and the elongated dielectric members 110. The mandrel cap material 138 also covers the first via 136. The mandrel cap material 138 may comprise an amorphous silicon or any type of hard mask material including metals such as titanium nitride (TiN), silicon nitride (SiN), silicon dioxide ($SiO_2$), and titanium dioxide ($TiO_2$) or other metal oxides. The mandrel cap material 138 may be deposited using, for example, any suitable deposition technique known in the art, including, but not limited to, chemical vapor deposition (CVD), plasma enhanced CVD (PECVD), physical vapor deposition (PVD), atomic layer deposition (ALD), molecular beam deposition (MBD), pulsed laser deposition (PLD), and/or liquid source misted chemical deposition (LSMCD).

Figure 10:
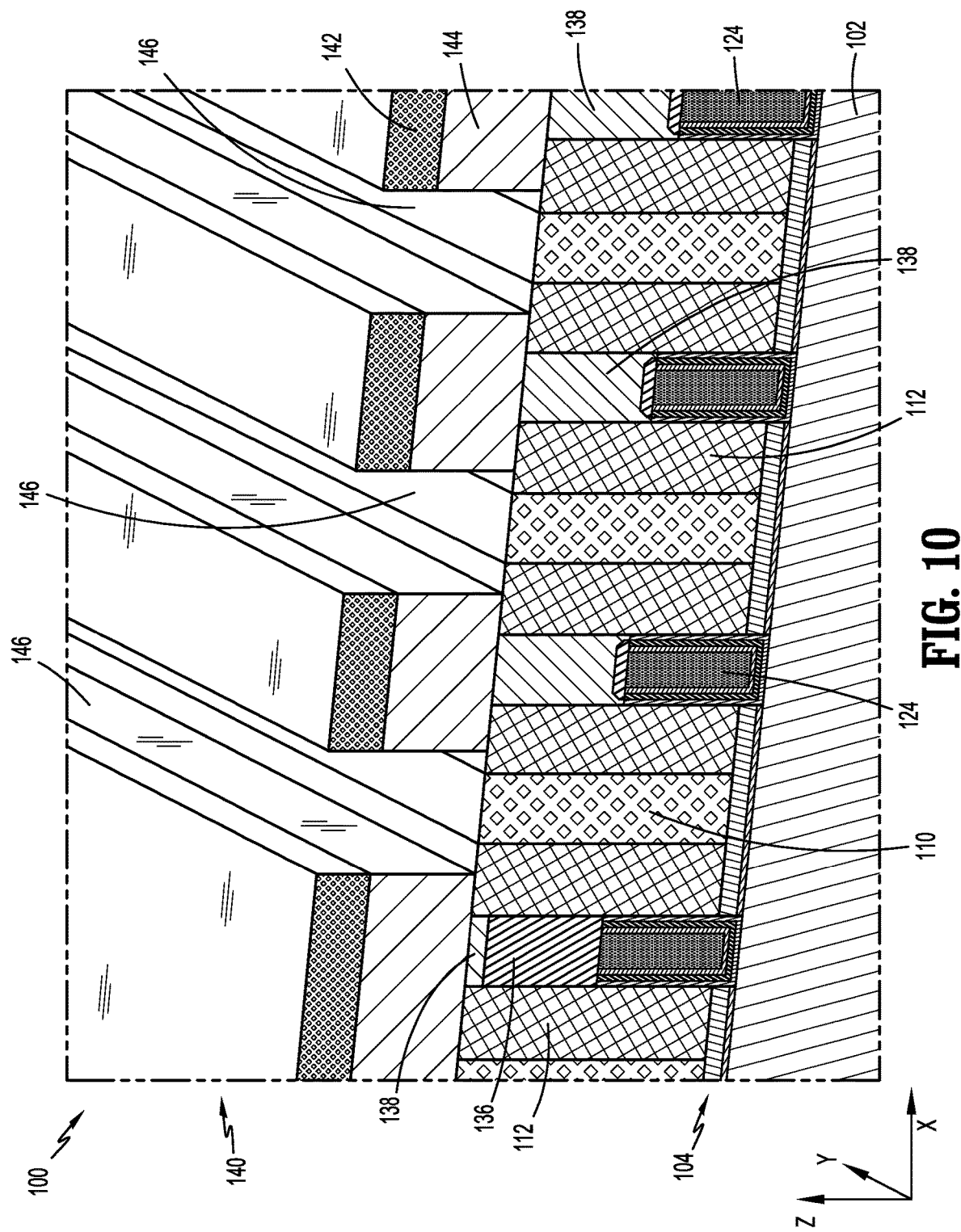
FIG. 10 is a perspective view in cross-section of the semiconductor structure at a tenth intermediate stage of fabrication according to one or more illustrative embodiments.
Figure 11:
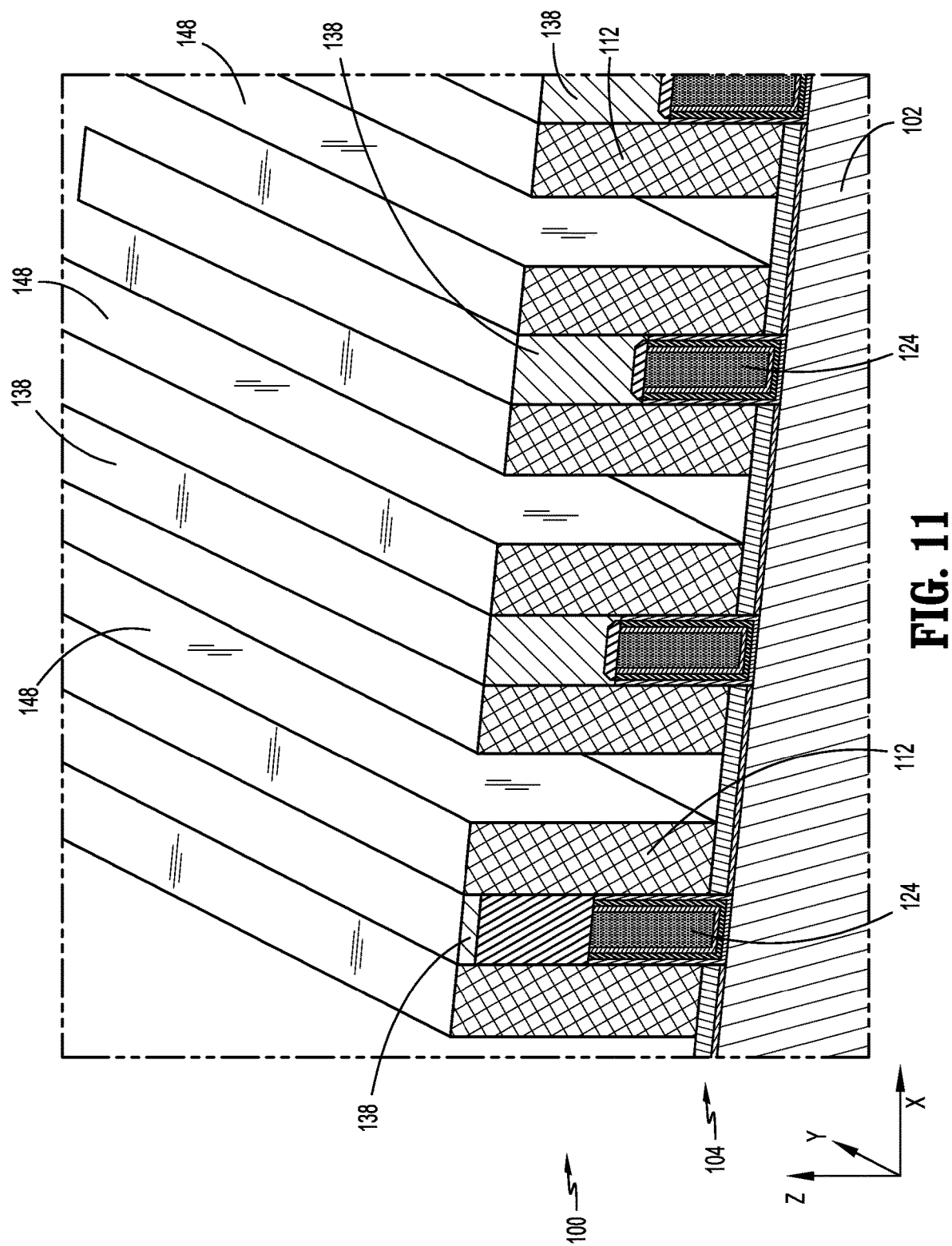
FIG. 11 is a perspective view in cross-section of the semiconductor structure at an eleventh intermediate stage of fabrication according to one or more illustrative embodiments.

With reference to FIG. 10, a tenth intermediate stage of fabrication of the semiconductor 100 is depicted. In accordance with the tenth stage, the mandrel cap material 138 is subjected to one or more polishing and/or planarization processes to make the upper surfaces of the mandrel cap material 138 substantially planar with the top of the elongated dielectric members 110. Thereafter, a second lithographic mask 140 is deposited on the semiconductor structure 100. The second mask 140 may be a tri-layer mask similar to the first mask described hereinabove, including a tri layer stack having a photoresist 142, an anti-reflective coating (ARC) (not specifically shown) underlying the photoresist 142, and an organic planarization layer (OPL) 144 beneath the photoresist 142 and the ARC coating. The second lithographic mask 140 is patterned to form an image of openings 146 in alignment with the elongated dielectric members 110. Through one or more lithographic image transfer and etching processes, the elongated dielectric members 110 are removed to form a plurality of second trenches 148 in the semiconductor structure 100 replacing the elongated dielectric members 110 as depicted in FIG. 11 corresponding to an eleventh intermediate stage of fabrication of the semiconductor structure 100. The etching processes utilized are selective to the materials of the spacer walls 112 and the mandrel cap material 148. The one or more etching processes terminate at the etch stop 104. The second trenches 148 are eventually filled to form a second pattern of even metal lines. FIG. 11 also illustrates removal of the second lithographic mask 140 from the semiconductor structure 100.

Figure 12:
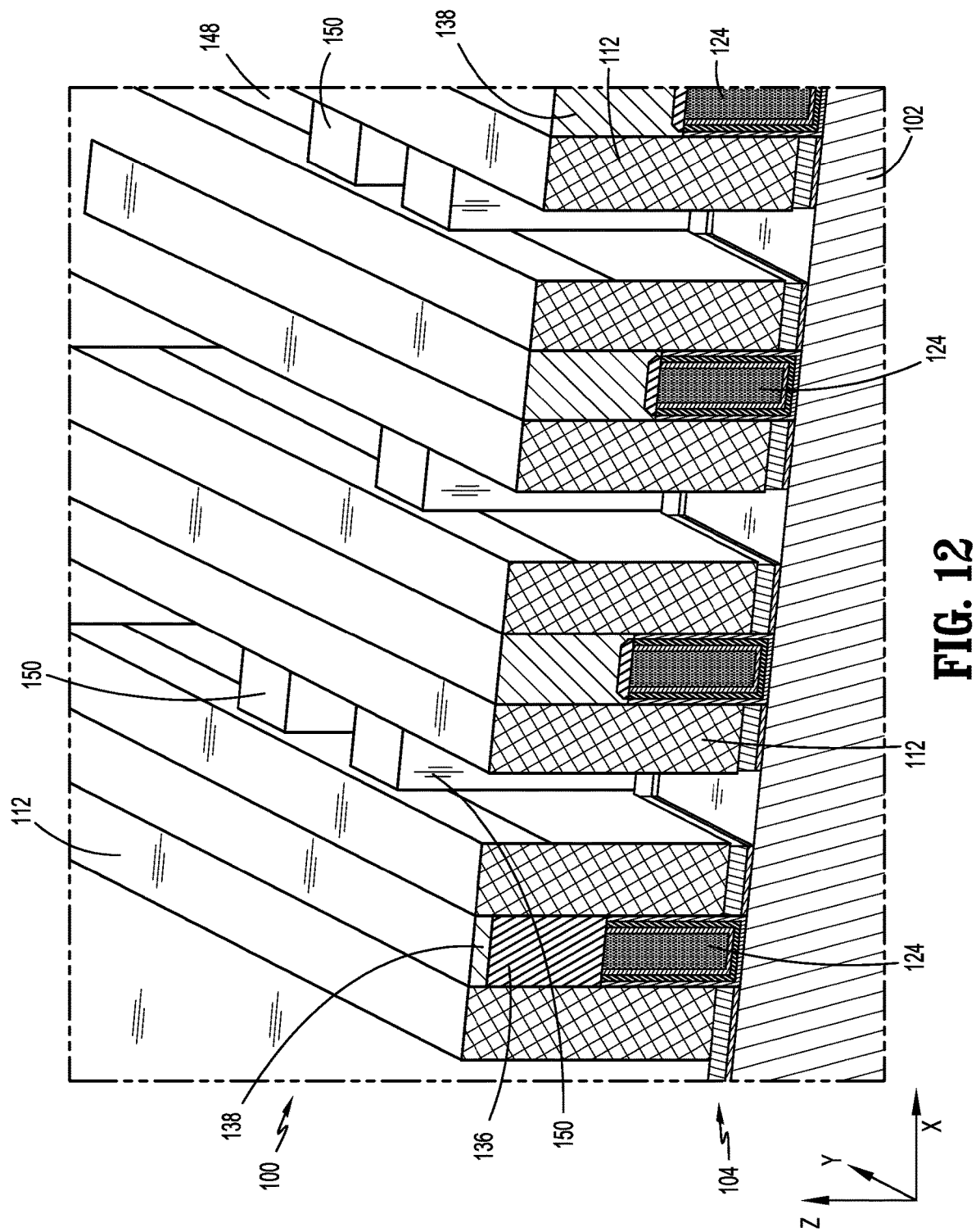
FIG. 12 is a perspective view in cross-section of the semiconductor structure at a twelfth intermediate stage of fabrication according to one or more illustrative embodiments.

With reference now to FIG. 12, a twelfth intermediate stage of fabrication of the semiconductor structure 100 includes deposition of a second plug material within the second trenches 148. Through suitable lithographic and etching processes, the second plug material is patterned to form second plug walls 150 which will form cuts or stops to be eventually formed in the even metal lines filling the second trenches 148. The second plug walls 150 are planarized or recessed to a position beneath the spacer walls 112. The second plug material may be the same as the aforedescribed first plug material.

Figure 13:
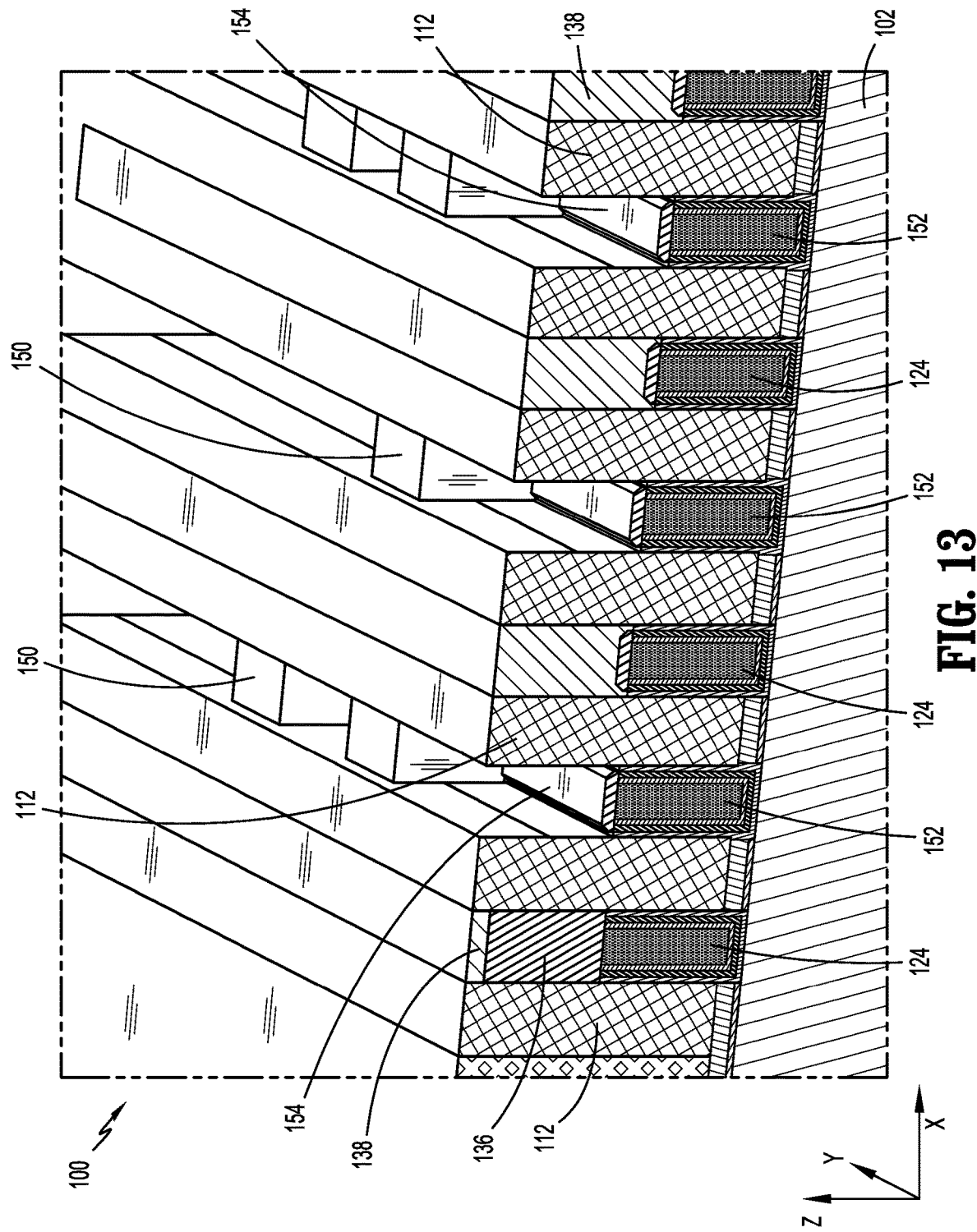
FIG. 13 is a perspective view in cross-section of the semiconductor structure at a thirteenth intermediate stage of fabrication according to one or more illustrative embodiments.

Referring now to FIG. 13, in a thirteenth stage of fabrication of the semiconductor structure 100, a second metallization process deposits a second metallic material in the second trenches 148. The metal of the second metallization process may be subjected to a planarization procedure to remove an overburden of metal and polished to form a second pattern of even metal lines 152. The even metal lines 152 may be recessed in the manner discussed hereinabove to extend about one-half (½) the height of the spacer walls 112. As an option, the even metal lines 152, may include a via contact layer 154 to enhance contact with a subsequently formed via. Thus, at this stage of fabrication, the semiconductor structure 100 includes odd and even metal lines 124, 152, first and second plug walls 118, 150 (see also FIG. 6) and mandrel cap material 138 covering the odd lines 124 and the first via 136.

Figure 14:
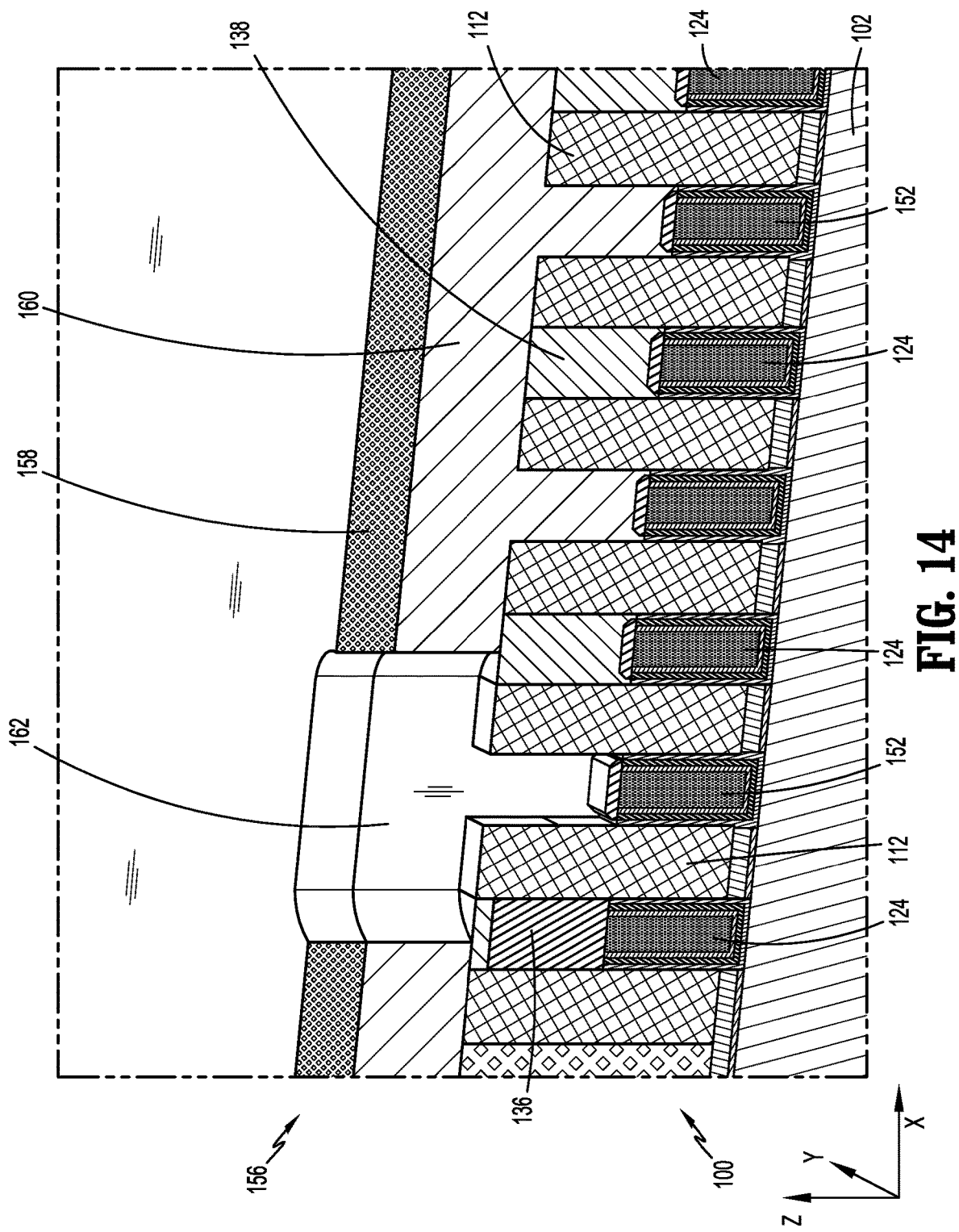
FIG. 14 is a perspective view in cross-section of the semiconductor structure at a fourteenth intermediate stage of fabrication according to one or more illustrative embodiments.
Figure 15:
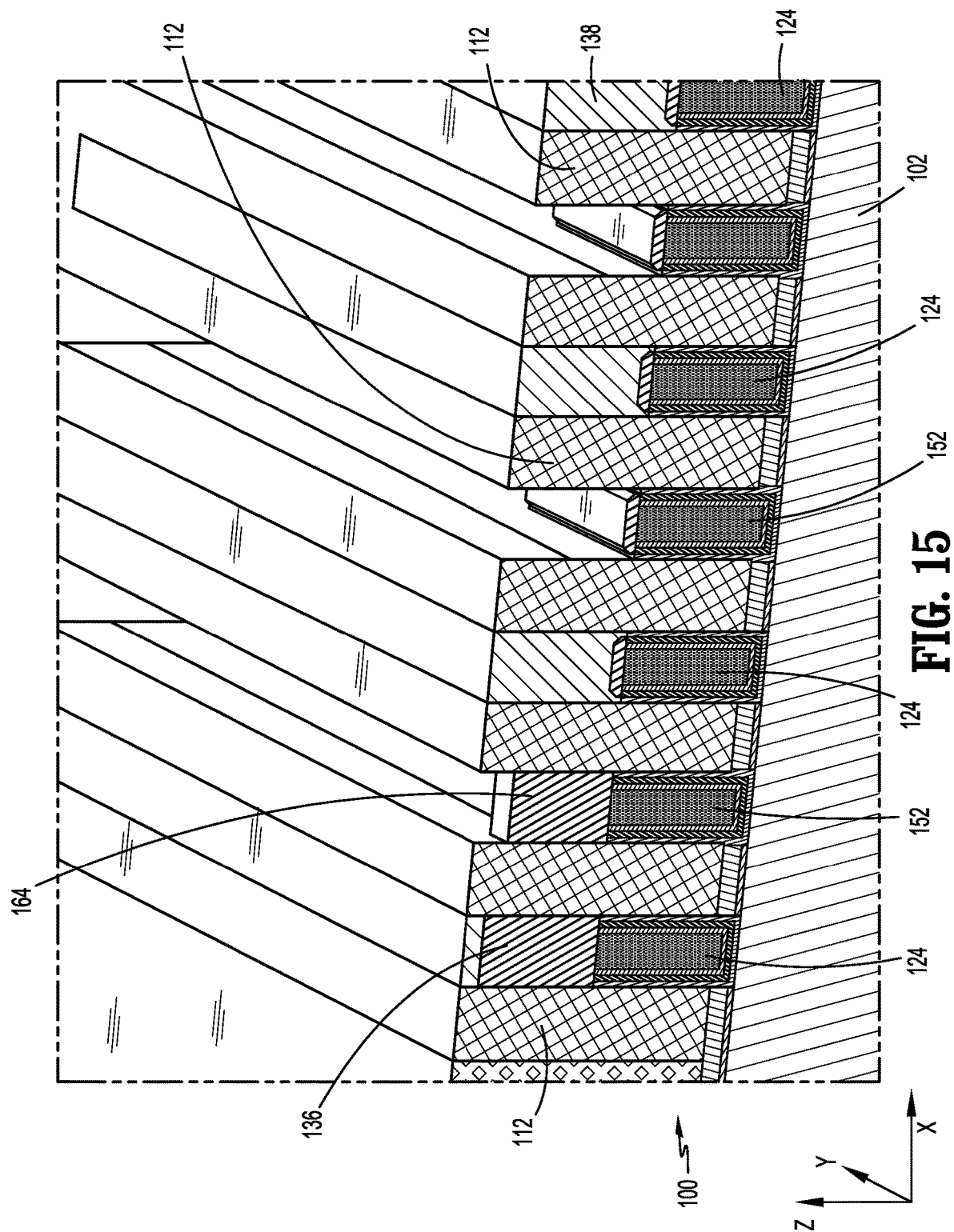
FIG. 15 is a perspective view in cross-section of the semiconductor structure at a fifteenth intermediate stage of fabrication according to one or more illustrative embodiments.

With reference now to FIG. 14, a fourteenth intermediate stage of fabrication of the semiconductor structure includes depositing a third lithographic mask 156 on the semiconductor structure 100 to form at least one via opening in alignment with a select even metal line 152. The third mask may be a tri-layer mask including a photoresist 158, an ARC layer (not shown) and an OPL fill 160 as discussed hereinabove. The third lithographic mask 156 is patterned to define an image of a via opening 162 which is in alignment with a select even metal line 152 of the second pattern, and which may extend to encompass one or more adjacent odd metal lines 122. More specifically, due to the presence of the protective mandrel cap material 138, patterning restrictions are relaxed in that the mandrel cap material 138 will protect the underlying odd metal lines 124 during any subsequent etching processes. Thus, similar, to the first via 136, a second via may be formed having an enlarged width relative to the select even metal line 152. Through one or more etching processes selective to the mandrel cap material 138 and the spacer walls 112, the via opening is formed. Thereafter, with reference now to FIG. 15 corresponding to a fifteenth stage of fabrication of the semiconductor structure 100, a conductive metal is deposited in the via opening to form a second via 164 in contacting engagement with the select even metal line 152 of the second pattern. The second via 164 has a larger width along the x-axis than the select even metal line. FIG. 15 also depicts the third lithographic mask removed which may be effected through any of the aforedescribed suitable etching processes.

Figure 16:
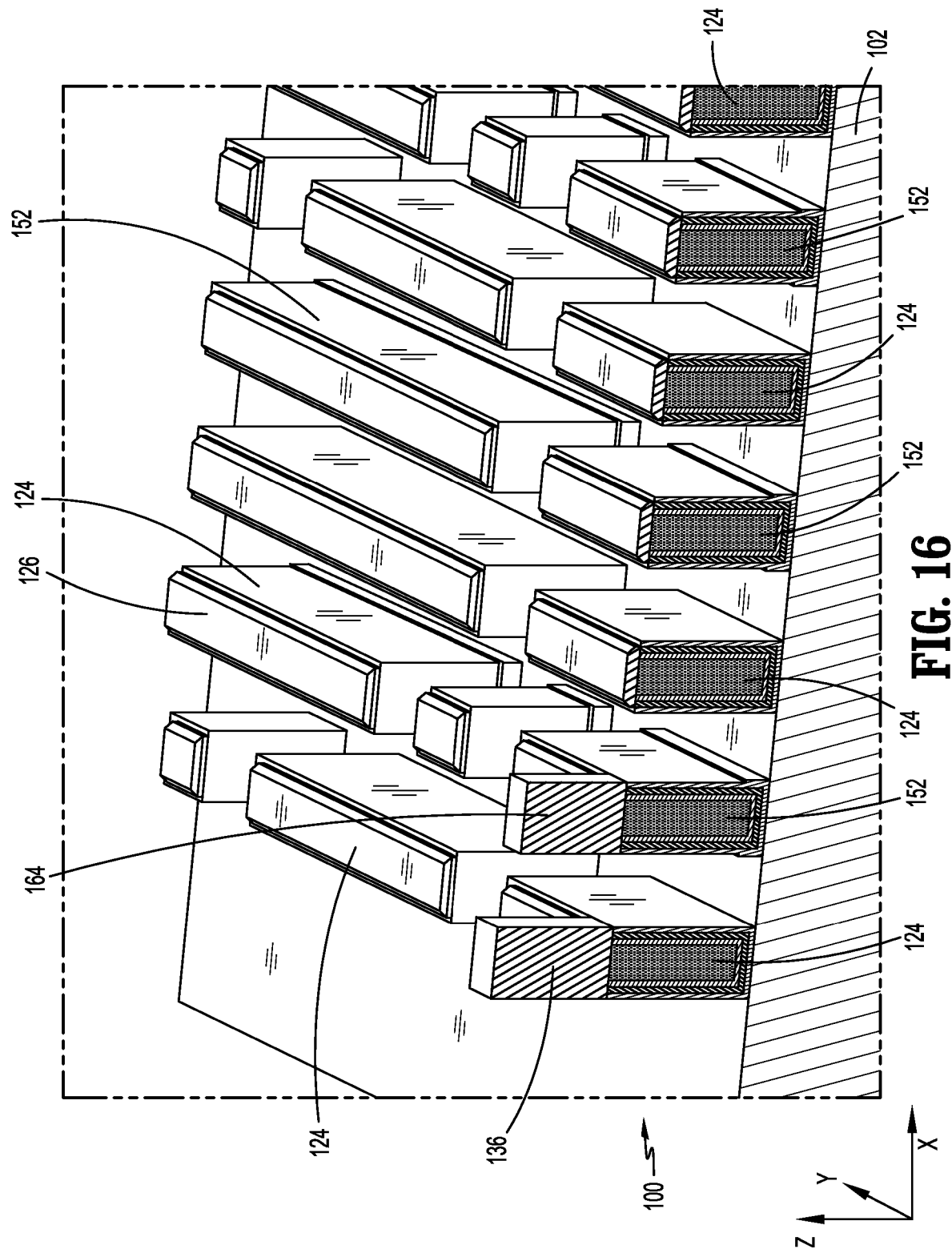
FIG. 16 is a perspective view in cross-section of the semiconductor structure at a sixteenth intermediate stage of fabrication according to one or more illustrative embodiments.

FIG. 16 illustrates a sixteenth intermediate stage of fabrication where the mandrel cap material 138, residual material of the template dielectric 108, the spacer walls 112, the plug walls 118, 150 and the etch stop 104 are removed from the semiconductor structure 100 leaving the first and second patterns of odd and even lines 124, 152 with breaks in the lines created by the plug walls 118, 150 and the first and second vias 136, 164. Any suitable combination of the removal, etching and/or planarization processes identified hereinabove may be utilized to remove these materials. Thus, at this stage of fabrication, the semiconductor structure 100 includes the semiconductor substrate 102, the first pattern of odd metal lines 122 with line breaks, a first via 136 extending to a select odd metal line 122, and a second pattern of even metal lines 152 with line breaks and a second via 164 extending to a select even metal line 152.

Figure 17:
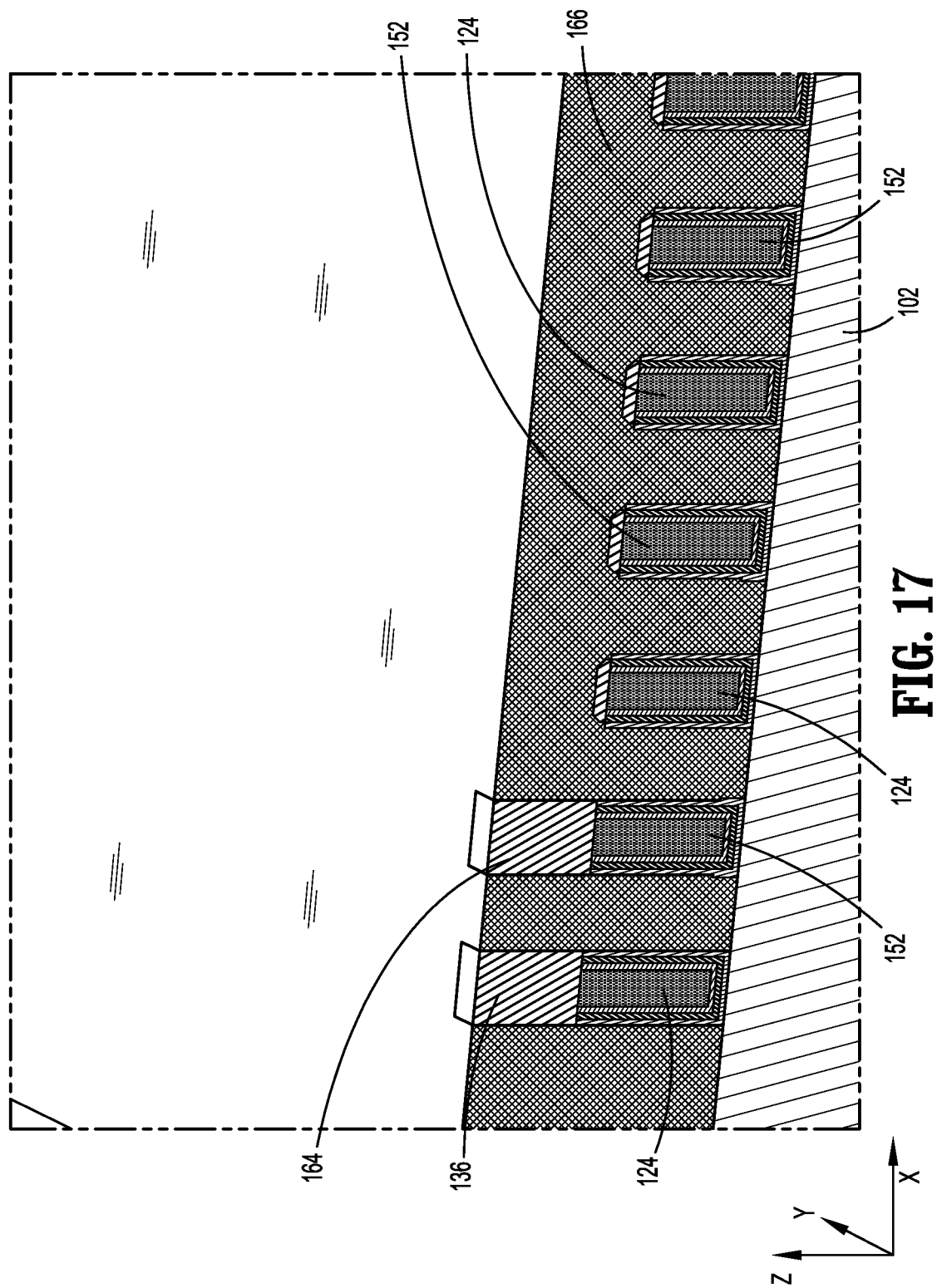
FIG. 17 is a perspective view in cross-section of the semiconductor structure at a seventeenth intermediate stage of fabrication according to one or more illustrative embodiments.

With reference to FIG. 17, the process is continued by depositing an interlayer dielectric onto the semiconductor substrate 102 to form an ILD layer 166 enclosing the first and second patterns of odd and even metal lines 124, 152 and the first and second vias 136, 164. The ILD layer 166 is formed of any suitable dielectric material that is commonly utilized in BEOL process technologies. In one exemplative embodiment, the ILD layer 166 comprises a flowable hydrogenated silicon carbon oxide (SiCOH) and/or a flowable hydrogenated C-rich silicon carbon oxide (C-rich SiCOH). These flowable ILD materials provide excellent gap fill, for example, between the odd and even metal lines 124, 152, and enhance planarization requiring minimal chemical-mechanical polish (CMP) processes. The dielectric constant of the SiCOH and C-rich SiCOH may be about 2.7 and 2.55, respectively. Other materials for the ILD layer 166 are also contemplated including silicon oxide (SiO2), silicon nitride (e.g., Si3N4) SiCH, SiCNH, or other types of silicon-based low-k dielectrics (e.g., k less than about 4.0), porous dielectrics, or known ULK (ultra-low-k) dielectric materials (with k less than about 2.5). The ILD layer 166 may be deposited using known deposition techniques, such as, for example, ALD, PVD, CVD, PECVD, or spin-on deposition. Thereafter, any known sequence of processing steps can be implemented to complete the fabrication of the semiconductor structure 100, the details of which are not needed to understand embodiments of the disclosure. In general, the ILD layer 166 is deposited on the semiconductor structure 100. Thereafter, using, e.g., known lithographic and etching processes, various additional electrical components are formed in a known manner. A BEOL (back end of line)

interconnect structure is formed to provide connections to/between other active or passive devices that are formed as part of the FEOL layer.

Thus, the fabrication process of the present disclosure facilitates the formation of a semiconductor structure having first and second patterns of odd and even lines with enlarged vias to be incorporated, for example, as a component of a BEOL interconnect structure. It is appreciated the aforedescribed process may be repeated several times to produce various metal lines within the dielectric layer to address the circuit architecture. Several metal lines may be formed simultaneously during one sequence of the process. Moreover, the process described herein produces metal lines with uniform breaks thereby addressing the deficiencies of conventional technologies, particularly, those technologies utilizing pillar processes or the like.

It is envisioned that the semiconductor structure 100 may be a part of a semiconductor and also a component of an integrated circuit. The resulting integrated circuit incorporating the semiconductor structure 100 can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuits, ranging from toys and other low-end applications to advanced computer products having a display, a keyboard or other input device, and a central processor.

It is to be understood that the embodiments discussed herein are not limited to the particular materials, features, and processing steps shown and described herein. In particular, with respect to the processing steps, it is to be emphasized that the descriptions provided herein are not intended to encompass all of the processing steps that may be required to form a functional semiconductor integrated circuit device.

The descriptions of the various illustrative embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
forming a plurality of elongated dielectric members on a semiconductor substrate defining a longitudinal axis, the elongated dielectric members extending vertically from the semiconductor substrate, each elongated dielectric member defining opposed vertical walls;
forming opposed spacer walls on each vertical wall of each elongated dielectric member, adjacent spacer walls of longitudinally adjacent elongated dielectric members defining a first trench therebetween;
depositing a first metal material within the first trenches to form a first set of first metal lines;
removing the elongated dielectric members to define a second trench between the opposed spacer walls on the opposed vertical walls of each elongated dielectric member; and
depositing a second metal material within the second trenches to form a second set of second metal lines, the first and second metal lines of the first and second sets being in alternating arrangement.

2. The method of claim 1 including forming a protective cap layer on the first metal lines of the first set prior to removing the elongated dielectric members.

3. The method of claim 2 wherein the protective cap layer comprises one of amorphous silicon, titanium nitride, silicon nitride, silicon dioxide, or titanium dioxide.

4. The method of claim 2 including forming a first metal via in contact with a select first metal line of the first set prior to forming the protective cap layer.

5. The method of claim 4 including removing the protective cap layer from the select first metal line subsequent to forming the first metal via.

6. The method of claim 4 including forming a second metal via in contact with a select second metal line of the second set.

7. The method of claim 6 wherein forming the second metal via includes utilizing an etching process selective to a material of the protective cap layer on the first metal lines of the first set.

8. The method of claim 6 wherein forming the first metal via and forming the second metal via includes forming the first and second metal vias to have widths greater than respective widths of the select first and second metal lines of the first and second sets.

9. The method of claim 6 further including:
recessing the first metal lines of the first set relative to the spacer walls prior to forming the first metal via; and
recessing the second metal lines of the second relative to the spacer walls prior to forming the second metal via.

10. The method of claim 1 wherein removing the elongated dielectric members includes an etching process selective to a material of the spacer walls.

11. The method of claim 1 including:
forming a first line cut within at least one first metal line; and
forming a second line cut within at least one second metal line.

12. The method of claim 11 wherein:
forming the first line cut includes depositing a plug material within a first trench associated with the at least one first metal line prior to depositing the first metal material within the first trenches; and
forming the second line cut includes depositing a plug material within a second trench associated with the at least one second metal line prior to depositing the second metal material within the second trenches.

13. A method comprising:
forming a dielectric template on a semiconductor substrate, the template comprising a plurality of longitudinally spaced elongated dielectric members;
depositing a spacer material onto the semiconductor substrate to fill spaces between the elongated dielectric members;
etching the spacer material to form opposed spacer walls on each elongated dielectric member, adjacent spacer walls of longitudinally adjacent dielectric members forming first trenches therebetween;
forming a first stop within at least one of the first trenches;

depositing a first metallic material into the first trenches to form a first pattern of first metal lines wherein the first stop forms a first line break in at least one of the first metal lines;

forming a first via in contact with a select first metal line;

depositing a mandrel cap material on the first metal lines and the first via;

removing the elongated dielectric members with an etching process selective to a material of the spacer walls to form second trenches between the spacer walls of each elongated dielectric member;

forming a second stop within at least one of the second trenches;

depositing a second metallic material into the second trenches to form a second pattern of second metal lines wherein the second stop forms a second line break in at least one of the second metal lines;

forming a via opening extending to a select second metal line utilizing an etching process selective to the mandrel cap material; and forming a second via in contact with the select second metal line.

14. The method of claim 13 wherein the mandrel cap material comprises one of amorphous silicon, titanium nitride, silicon nitride, silicon dioxide, or titanium dioxide.

15. The method of claim 13 wherein forming a via opening includes utilizing a lithographic mask, and patterning the mask to form an image of the via opening image having a width greater than a width of the second via.

16. The method of claim 13 wherein:

forming the first stop includes depositing a plug material within a first trench associated with the at least one first metal line prior to depositing the first metal material within the first trenches; and forming the second stop includes depositing a plug material within a second trench associated with the at least one second metal line prior to depositing the second metal material within the first second trenches.

17. The method of claim 13 including removing the mandrel cap material.

18. The method of claim 17 wherein removing the mandrel cap material is performed at least in part subsequent to forming the via opening.

19. The method of claim 18 including removing the plug material.

20. The method of claim 19 including forming an interlayer dielectric on the semiconductor substrate at least partially enclosing the first and second patterns of first and second metal lines and the first and second vias.

* * * * *